(12) United States Patent
Chuang et al.

(10) Patent No.: US 8,728,900 B2
(45) Date of Patent: May 20, 2014

(54) INTEGRATING THE FORMATION OF I/O AND CORE MOS DEVICES WITH MOS CAPACITORS AND RESISTORS

(71) Applicant: Taiwan Semiconductor Manufacturing Company, Ltd., Hsin-Chu (TW)

(72) Inventors: Harry Chuang, Singapore (SG); Mong-Song Liang, Hsin-Chu (TW); Wen-Chih Yang, Hsin-Chu (TW); Chien-Liang Chen, Hsin-Chu (TW); Chii-Horng Li, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/649,844

(22) Filed: Oct. 11, 2012

(65) Prior Publication Data

US 2013/0034946 A1 Feb. 7, 2013

Related U.S. Application Data

(63) Continuation of application No. 12/191,817, filed on Aug. 14, 2008, now Pat. No. 8,294,216.

(51) Int. Cl.
*H01L 21/20* (2006.01)

(52) U.S. Cl.
USPC ............ 438/382; 257/368; 257/E21.004

(58) Field of Classification Search
USPC ................................. 438/382; 257/368
See application file for complete search history.

(56) References Cited

U.S. PATENT DOCUMENTS

| | | | |
|---|---|---|---|
| 5,457,062 A | 10/1995 | Keller et al. | |
| 5,618,749 A | 4/1997 | Takahashi et al. | |
| 5,736,421 A | 4/1998 | Shimomura et al. | |
| 6,043,157 A | 3/2000 | Gardner et al. | |
| 6,169,019 B1 | 1/2001 | Takagi | |
| 6,251,729 B1 * | 6/2001 | Montree et al. | 438/257 |
| 6,333,222 B1 | 12/2001 | Kitazawa et al. | |
| 6,436,747 B1 | 8/2002 | Segawa et al. | |
| 7,160,767 B2 | 1/2007 | Brask et al. | |
| 7,183,596 B2 | 2/2007 | Wu et al. | |
| 7,271,045 B2 | 9/2007 | Prince et al. | |
| 7,297,587 B2 | 11/2007 | Wu et al. | |
| 2001/0001075 A1 | 5/2001 | Ngo et al. | |
| 2001/0052611 A1 | 12/2001 | Kim | |
| 2002/0142540 A1 | 10/2002 | Katayama | |
| 2003/0181009 A1 | 9/2003 | Nakagawa | |
| 2003/0183880 A1 | 10/2003 | Goto et al. | |

(Continued)

FOREIGN PATENT DOCUMENTS

CN 1450600 A 10/2003

*Primary Examiner* — A. Sefer
(74) *Attorney, Agent, or Firm* — Slater & Matsil, L.L.P.

(57) ABSTRACT

An integrated circuit structure includes a semiconductor substrate, and a first and a second MOS device. The first MOS device includes a first gate dielectric over the semiconductor substrate, wherein the first gate dielectric is planar; and a first gate electrode over the first gate dielectric. The second MOS device includes a second gate dielectric over the semiconductor substrate; and a second gate electrode over the second gate dielectric. The second gate electrode has a height greater than a height of the first gate electrode. The second gate dielectric includes a planar portion underlying the second gate electrode, and sidewall portions extending on sidewalls of the second gate electrode.

20 Claims, 10 Drawing Sheets

(56) References Cited

U.S. PATENT DOCUMENTS

| | | |
|---|---|---|
| 2003/0207555 A1 | 11/2003 | Takayanagi et al. |
| 2004/0061150 A1 | 4/2004 | Cho et al. |
| 2004/0099910 A1 | 5/2004 | Choe et al. |
| 2005/0051866 A1 | 3/2005 | Wang et al. |
| 2005/0142756 A1 | 6/2005 | Park et al. |
| 2005/0280000 A1 | 12/2005 | Ishii et al. |
| 2006/0086975 A1 | 4/2006 | Liaw |
| 2006/0113627 A1 | 6/2006 | Chen et al. |
| 2006/0278934 A1 | 12/2006 | Nagahama |
| 2007/0075374 A1 | 4/2007 | Kudou |
| 2007/0102754 A1 | 5/2007 | Chen et al. |
| 2007/0235817 A1 | 10/2007 | Wang et al. |
| 2008/0122011 A1 | 5/2008 | Wu |
| 2008/0138969 A1 | 6/2008 | Kaneko et al. |
| 2008/0173947 A1 | 7/2008 | Hou et al. |
| 2009/0001477 A1 | 1/2009 | Hsu et al. |
| 2009/0039433 A1 | 2/2009 | Yang et al. |
| 2009/0042348 A1 | 2/2009 | Yamamoto |
| 2009/0098692 A1 | 4/2009 | Lian et al. |
| 2009/0236669 A1 | 9/2009 | Chen et al. |
| 2010/0001332 A1 | 1/2010 | Chuang et al. |
| 2010/0178739 A1* | 7/2010 | Pas ................................ 438/229 |

\* cited by examiner

INTEGRATING THE FORMATION OF I/O AND CORE MOS DEVICES WITH MOS CAPACITORS AND RESISTORS

This application is a continuation of U.S. patent application Ser. No. 12/191,817, filed on Aug. 14, 2008, entitled "Integrating the Formation of I/O and Core MOS Devices with MOS Capacitors and Resistors," which application is hereby incorporated herein by reference in its entirety.

TECHNICAL FIELD

This invention relates generally to integrated circuits, and more particularly to the formation of metal-oxide-semiconductor (MOS) devices having polysilicon gates and MOS devices having metal gates.

BACKGROUND

Complementary metal-oxide-semiconductor (MOS) devices have been the basic logic building blocks in the formation of integrated circuits. In traditional IC processes, gate electrodes are typically formed of polysilicon. One of the reasons for polysilicon's wide use is that the work function of polysilicon gate electrodes can be changed easily by doping with different impurities. However, polysilicon has depletion problems, and hence metal gate electrodes were introduced, particularly for MOS device in core regions, to avoid the poly depletion phenomenon.

With the adoption of metal gates, naturally, core MOS devices, input/output (I/O) MOS devices, and static random access memory (SRAM) MOS devices may all have metal gates, so that they can be manufactured simultaneously to reduce the manufacturing cost. In addition, other devices manufactured simultaneously with the MOS devices, such as resistors, MOS capacitors, and the like, will also be formed of metals. This significantly changes the electrical properties of these devices. The standard libraries built in the past decades for simulating the behavior of these devices thus have to be rebuilt, which is highly costly and time consuming.

In addition, I/O MOS devices typically prefer thick silicon oxides as the gate dielectrics. Therefore, integration schemes have been developed to integrate I/O MOS devices having polysilicon gates and core MOS devices having metal gates on a same chip. However, the manufacturing schemes for forming such structures are often complicated, and the manufacturing cost is high.

Accordingly, what is needed in the art is an integrated manufacturing scheme to satisfy both the requirements of the core MOS devices and I/O MOS devices, and to address the standard library issues.

SUMMARY OF THE INVENTION

In accordance with one aspect of the present invention, an integrated circuit structure includes a semiconductor substrate, and a first and a second MOS device. The first MOS device includes a first gate dielectric over the semiconductor substrate, wherein the first gate dielectric is planar; and a first gate electrode over the first gate dielectric. The second MOS device includes a second gate dielectric over the semiconductor substrate; and a second gate electrode over the second gate dielectric. The second gate electrode has a height greater than a height of the first gate electrode. The second gate dielectric includes a planar portion underlying the second gate electrode, and sidewall portions extending on sidewalls of the second gate electrode.

In accordance with another aspect of the present invention, an integrated circuit structure includes a semiconductor substrate; an input/output (I/O) MOS device, and a core MOS device. The I/O MOS device includes a first gate dielectric over the semiconductor substrate; and a first gate electrode over the first gate dielectric. The core MOS device includes a second gate dielectric over the semiconductor substrate; and a second gate electrode over the second gate dielectric, wherein the second gate electrode has a height greater than a height of the first gate electrode. The integrated circuit structure further includes a passive device selected from the group consisting essentially of a resistor and a MOS capacitor, wherein the passive device has a height substantially equal to the height of the first gate electrode.

In accordance with yet another aspect of the present invention, an integrated circuit structure includes a semiconductor substrate; an I/O MOS device, and a core MOS device. The I/O MOS device includes a first gate dielectric over the semiconductor substrate; and a first gate electrode over the first gate dielectric, wherein the first gate electrode includes a first polysilicon portion, and a first silicide portion over the first polysilicon portion. The core MOS device includes a second gate dielectric over the semiconductor substrate; and a second gate electrode including a metallic material over the second gate dielectric. The second gate dielectric includes a planar portion underlying the second gate electrode, and sidewall portions extending on sidewalls of the second gate electrode. The integrated circuit structure further includes a resistor including a second polysilicon portion, and a second silicide portion on the second polysilicon portion; and a MOS capacitor including a plate comprising a third polysilicon portion, and a third silicide portion on the third polysilicon portion.

In accordance with yet another aspect of the present invention, a method of forming an integrated circuit structure includes providing a semiconductor chip having a semiconductor substrate, wherein the semiconductor chip comprises a first region and a second region; forming a first gate dielectric layer over the semiconductor substrate and in the first region; forming a first silicon layer in the first and the second regions, wherein the first silicon layer is over the first gate dielectric; forming a second silicon layer on and contacting a portion of the first silicon layer in the second region, wherein the first region is free from the second silicon layer; performing a first patterning on the first silicon layer in the first region to form a first gate electrode of a first MOS device; performing a second patterning on the first and the second silicon layers in the second region to form a dummy gate of a second MOS device; and replacing the dummy gate with a metal gate to form a second gate electrode for the second MOS device.

In accordance with yet another aspect of the present invention, a method of forming an integrated circuit structure includes providing a semiconductor chip including a semiconductor substrate, wherein the semiconductor chip includes a first region and a second region; forming a first gate dielectric layer over the semiconductor substrate, wherein the first gate electric layer is in the first region and not in the second region; forming a first polysilicon layer in the first and the second regions, wherein the first polysilicon layer is over the first gate dielectric; forming a first hard mask covering a first portion of the first polysilicon layer in the first region, wherein a second portion of the first polysilicon layer in the second region is uncovered by the first mask; blanket forming a second polysilicon layer over the first hard mask and the first polysilicon layer; blanket forming a second hard mask layer over the second polysilicon layer; removing portions of the second hard mask layer and the second polysilicon layer from the first region; performing a first patterning on the first portion of the first polysilicon layer to form a gate electrode for an input/output (I/O) MOS device; forming a silicide on the gate electrode of the I/O device; performing a second patterning on the first and the second silicon layers in the second region to form a dummy gate for a core MOS device; forming gate spacers and source/drain regions for each of the I/O MOS device and the core MOS device; forming a contact etch stop layer (CESL) over the I/O MOS device and the core MOS device; forming an inter-layer dielectric (ILD) over the CESL; performing a CMP until at least a portion of the CESL directly over the dummy gate is exposed; and replacing the dummy gate with a metal gate to form a second gate electrode for the core MOS device.

In accordance with yet another aspect of the present invention, a method of forming an integrated circuit structure includes providing a semiconductor chip comprising a semiconductor substrate, wherein the semiconductor chip comprises a first region and a second region; and forming a first and a second MOS device in the first region. The step of forming the first MOS device includes forming a first gate dielectric over the semiconductor substrate, wherein the first gate dielectric is planar; and forming a first gate electrode over the first gate dielectric. The step of forming the second MOS device includes forming a second gate dielectric over the semiconductor substrate; and forming a second gate electrode over the second gate dielectric. The second gate electrode has a height greater than a height of the first gate electrode. The second gate dielectric includes a planar portion underlying the second gate electrode, and sidewall portions extending on sidewalls of the second gate electrode.

The embodiments of the present invention provide an integrated manufacturing process for forming resistors, MOS capacitors, I/O MOS devices, SRAM MOS devices, and core MOS devices with reduced complexity and cost. By using the embodiments of the present invention, conventional standard libraries for resistors, MOS capacitors can continuously be used.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

An integration scheme integrating the manufacture of core metal-oxide-semiconductor (MOS) devices, input/output (I/O) MOS device, static random access memory (SRAM) MOS devices, resistors, MOS capacitors, and the like, is provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1:
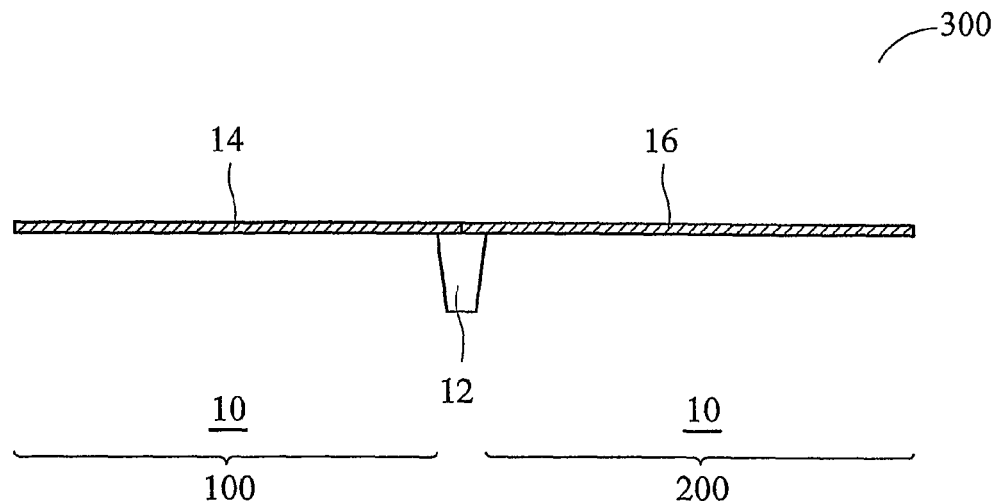
FIGS. 1 through 18 illustrate cross-sectional views of intermediate stages in the manufacturing of an embodiment of the present invention, wherein a MOS device having a polysilicon gate and a MOS device having a metal gate are formed.

Referring to FIG. 1, semiconductor chip 300, which includes region 100 and region 200, is provided. Throughout the description, each element may be referred to using a reference numeral followed by letters "A" and "B," indicating that the corresponding element is in region 100 and region 200, respectively. The devices in region 100 and region 200 may have different designs, and may be customized for different functions. For example, region 100 may be a core region having core devices, and/or a SRAM region having SRAM devices, while region 200 may be a peripheral region such as an input/output (I/O) region, a high-voltage device region, or the like. Semiconductor chip 300 includes substrate 10, and shallow trench isolation (STI) region 12 in semiconductor substrate 10, wherein STI region 12 separates region 100 and region 200. Semiconductor substrate 10 can be formed of common semiconductor materials such as silicon, SiGe, strained silicon on SiGe, silicon on insulator (SOI), silicon germanium on insulator (SGOI), germanium on insulator (GOI), or the like.

Gate oxide 14 is formed in region 100 and over semiconductor substrate 10. Although the gate oxide 14 is referred to as an oxide, it may comprise other materials. In an embodiment, gate oxide 14 includes thermal silicon oxide. In other embodiments, gate oxide 14 may comprise silicon oxynitride, and may have a single-layer structure or a composite structure such as oxide-nitride-oxide (ONO). The formation methods include chemical vapor deposition (CVD) techniques such as low temperature CVD (LTCVD), low pressure CVD (LPCVD), plasma enhanced CVD (PECVD), atomic layer deposition (ALD), or the like. Sacrificial oxide 16, which is typically thin, may be formed in region 200. Again, sacrificial oxide 16 may be formed of silicon oxide, a high-k dielectric material, or other commonly used dielectric materials.

Figure 2:
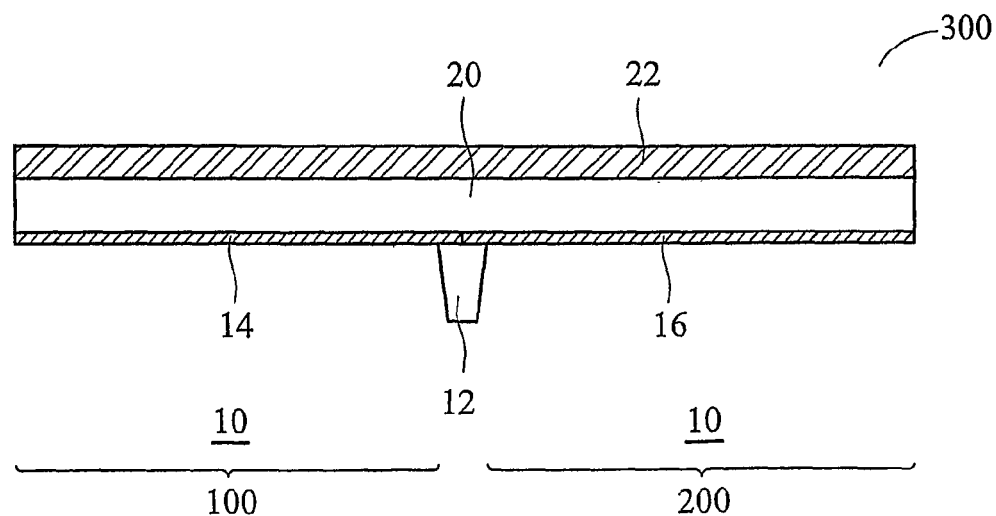

FIG. 2 illustrates the formation of silicon layer 20 and hard mask 22. Silicon layer 20 is preferably formed of polysilicon, and may have a preferred thickness of less than about 350 Å, more preferably between about 200 Å and about 500 Å. One skilled in the art will realize, however, that the dimensions recited throughout the description are merely examples, and will change if different forming technologies are used. In alternative embodiments, layer 20 comprises amorphous silicon. Hard mask 22 may include silicon nitride or other commonly known hard mask materials. Silicon layer 20 may be doped with a p-type or n-type impurity.

Figure 3:
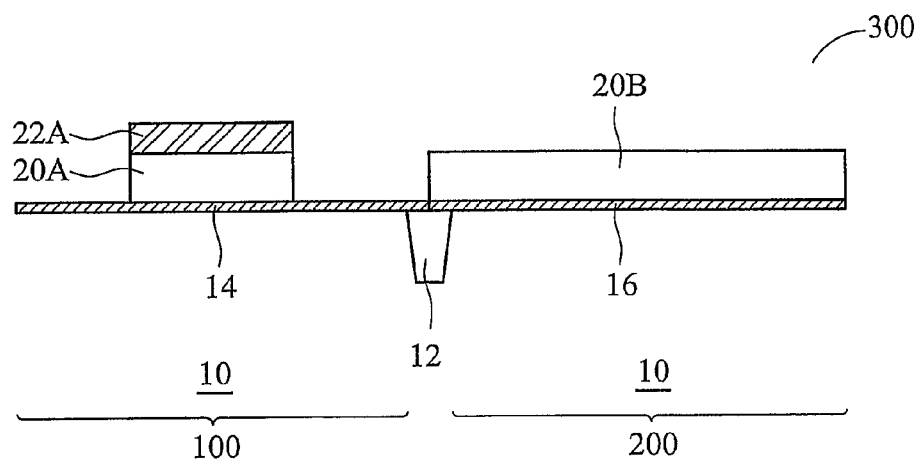

Referring to FIG. 3, hard mask 22 is removed from region 200. In an embodiment, as shown in FIG. 3, the portions of hard mask 22 and silicon layer 20 in region 100 is patterned. In alternative embodiments, no patterning is performed in the region 100. The removal of hard mask 22 may include forming a photo resist to cover portions of hard mask 22, and etching hard mask 22 using, for example, diluted HF. In subsequent paragraphs, the portion of hard mask 22 in region 100 is referred to as hard mask 22A, and the portions of silicon layer 20 in region 100 and region 200 are referred to as silicon portions 20A and 20B, respectively.

Figure 4:
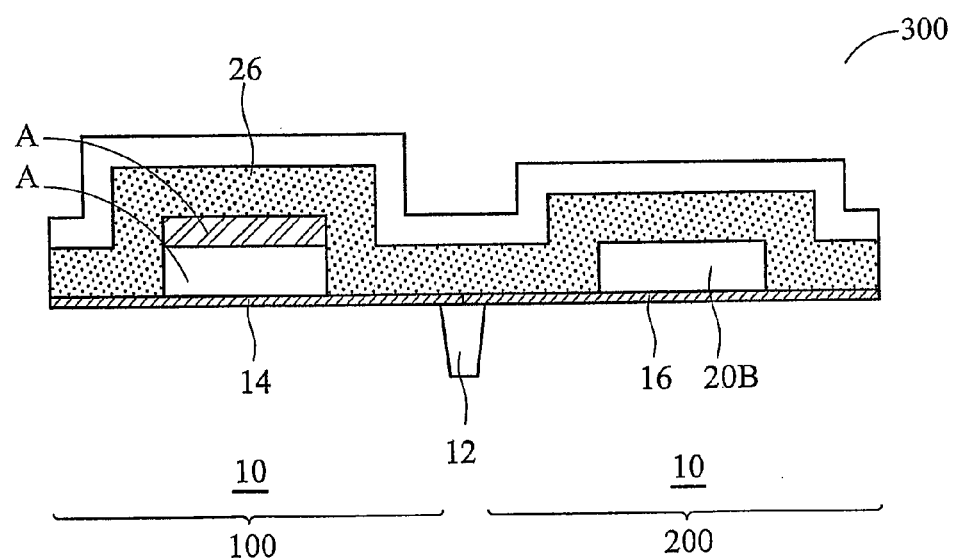

Referring to FIG. 4, silicon layer 26 and hard mask 28 are formed. Similar to silicon layer 20, silicon layer 26 may be formed of polysilicon or amorphous silicon. The thickness of silicon layer 26 may be between about 200 Å and about 500 Å. Hard mask 28 may also include silicon nitride or other commonly known hard mask materials. It is noted that in region 200, silicon layer 26 may be stacked on, and adjoin silicon layer 22. The resulting thickness of the combined silicon layer 20/26 may be between about 500 Å and about 2500 Å.

Figure 5:
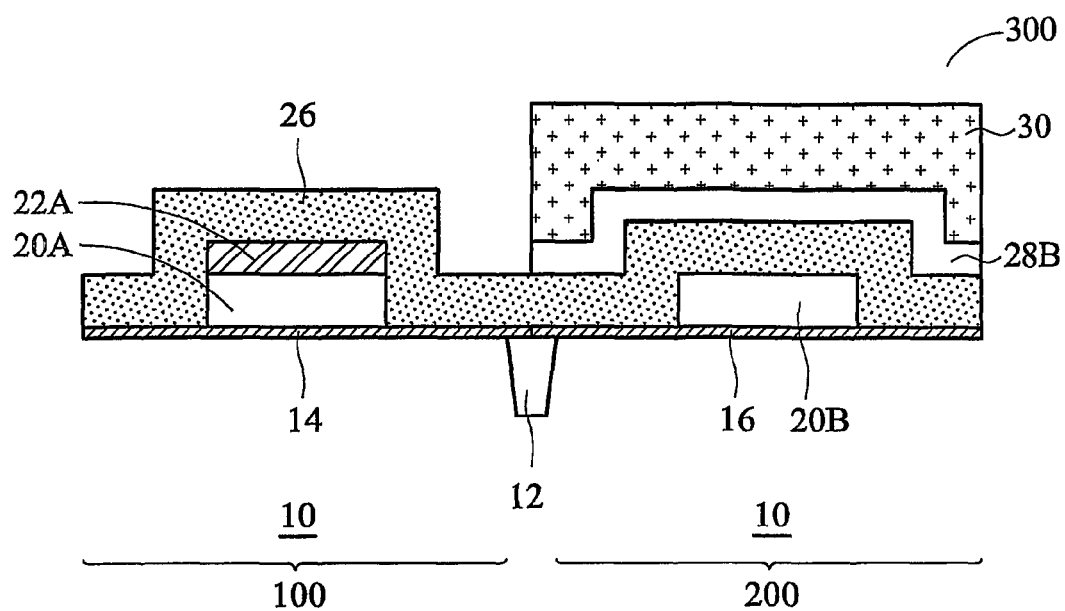
Figure 6:
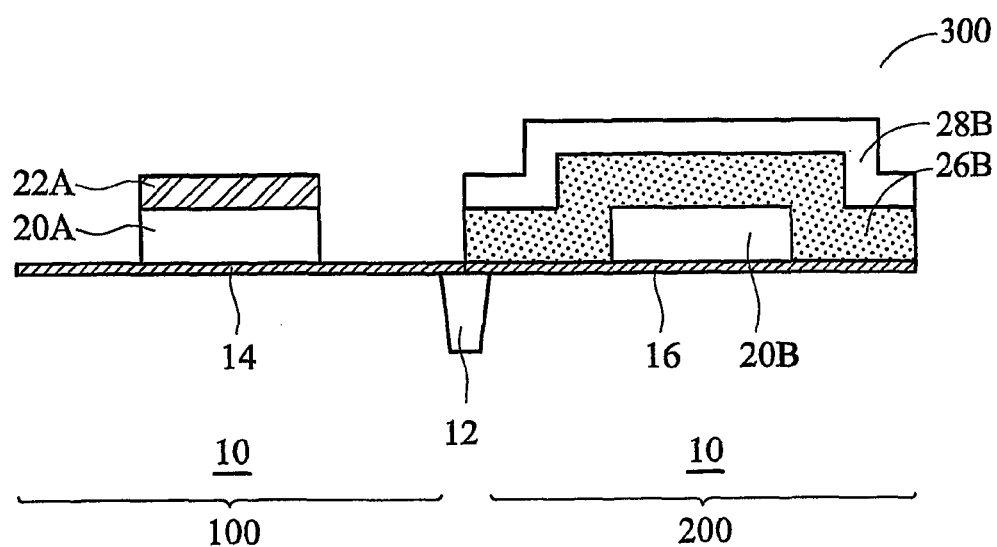

In FIG. 5, photo resist 30 is applied and patterned to cover region 200, while region 100 is exposed. The portion of hard mask 28 in region 100 is then removed, exposing the portion of silicon layer 26 in region 100. Hard mask 28B in region 200 is protected by photo resist 30. Next, as shown in FIG. 6, photo resist 30 is removed by ashing, and hence hard mask 28B is exposed. An etching is then performed to remove the portion of silicon layer 26 in region 100, wherein hard mask 28B protects the underlying silicon layers 20B and 26B from being etched.

Figure 7:
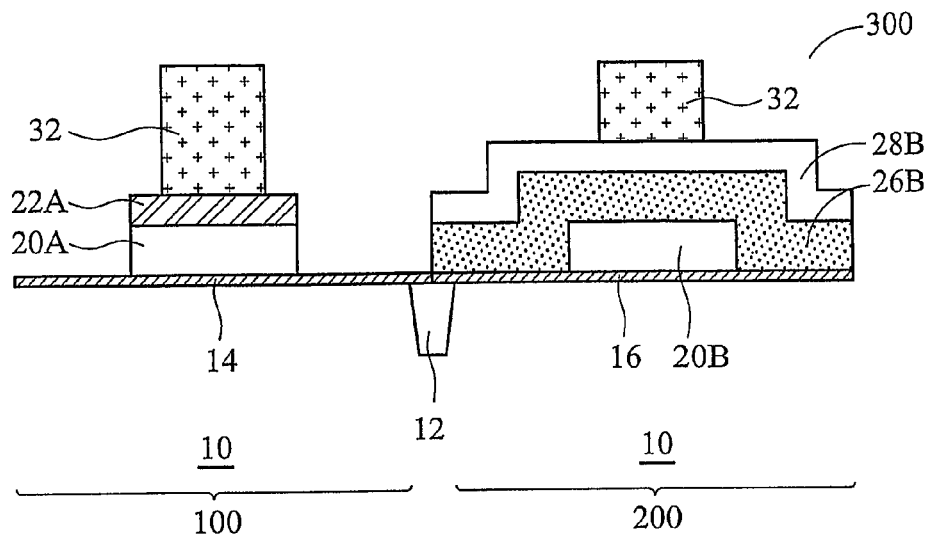
Figure 8:
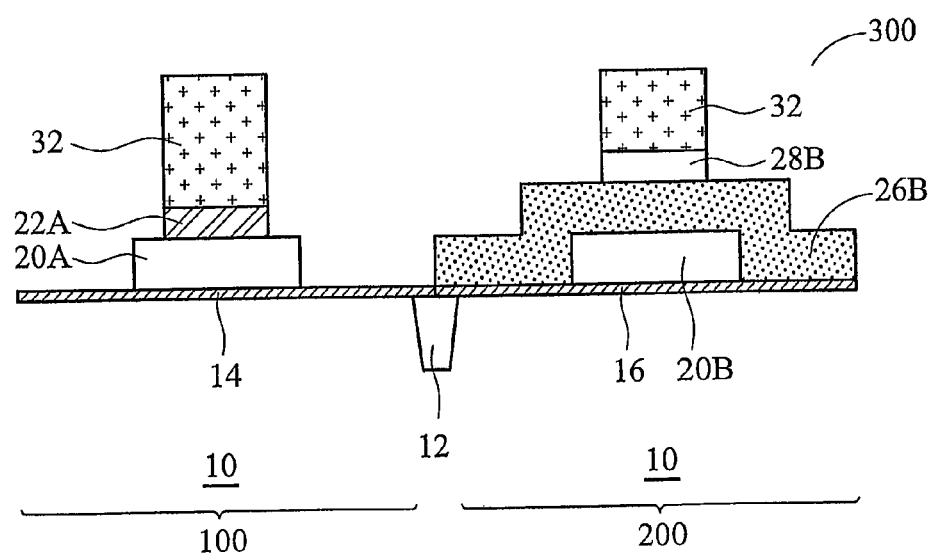

In FIG. 7, photo resist 32 is applied and patterned, with remaining portions over hard masks 22A and 28B. Preferably, a portion of photo resist 32 resides directly overlying silicon layer 20B, and is either smaller than, or co-terminus with, silicon layer 20B. Hard masks 22A and 28B are then patterned, as shown in FIG. 8.

Figure 9:
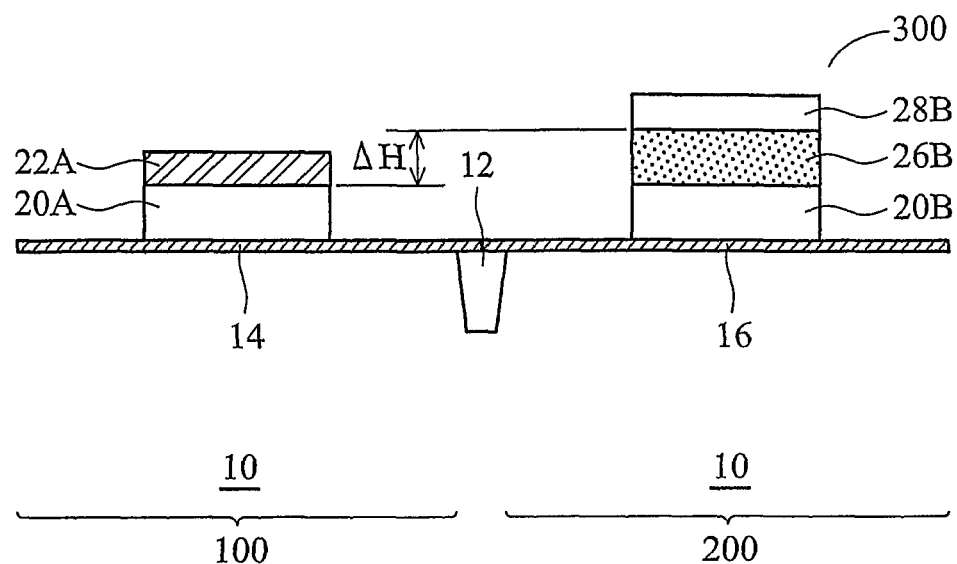

Next, silicon layers 20A, 26B, and 20B are patterned according to the patterns of hard masks 22A and 28B. The resulting structure is shown in FIG. 9. It is noted that the top surfaces of silicon layer 20A and silicon layer 26B have a height difference ΔH, which equals to the thickness of silicon layer 26B.

In an embodiment, at the same time silicon layer 20A is formed by patterning, additional features, such as the silicon portions of resistor 56 and MOS capacitor 58 (not shown in FIG. 9, please refer to FIG. 19) are also formed in region 100. Accordingly, resistor 56 and MOS capacitor 58 have a same height as the gate of the resulting MOS device 110 in region 100.

Figure 10:
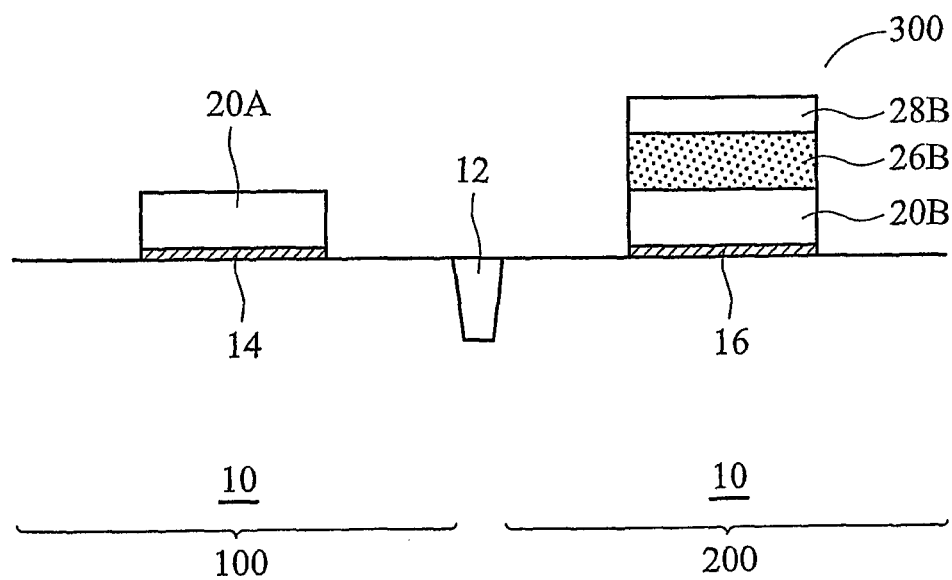
Figure 11:
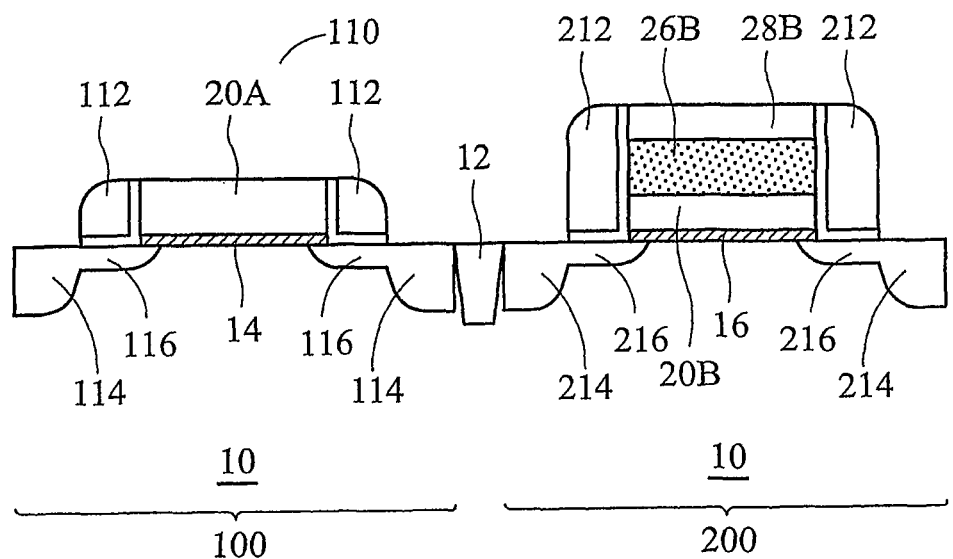
Figure 12:
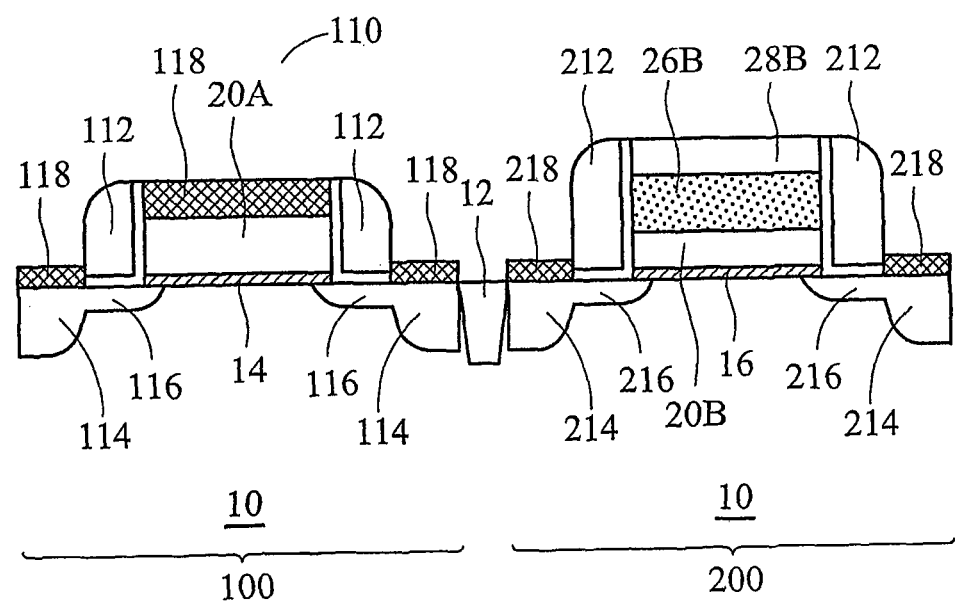

FIGS. 10, 11, and 12 illustrate the formation of MOS device 110, in which silicon layer 20A acts as the gate electrode. Refer to FIG. 10, hard mask 22A is removed from region 100, preferably using a photo resist (not shown) to cover region 200. In FIG. 11, gate spacers 112 and 212, source/drain regions 114 and 214, and lightly doped source/drain regions 116 and 216, are formed in regions 100 and 200, respectively. In FIG. 12, silicide regions 118 and 218 are formed. Since resistor 56 and MOS capacitor 58 (refer to FIG. 19) may also be formed in region 100, silicides 118 are simultaneously formed on the silicon portions of resistor 56 and MOS capacitor 58 (refer to FIG. 19). MOS device 110 is a gate-first MOS device, since the gate electrode 20A is formed before the formation of other components, such as gate spacers 112 and source/drain regions 114. In an exemplary embodiment, MOS device 110 is an I/O MOS device.

Figure 13:
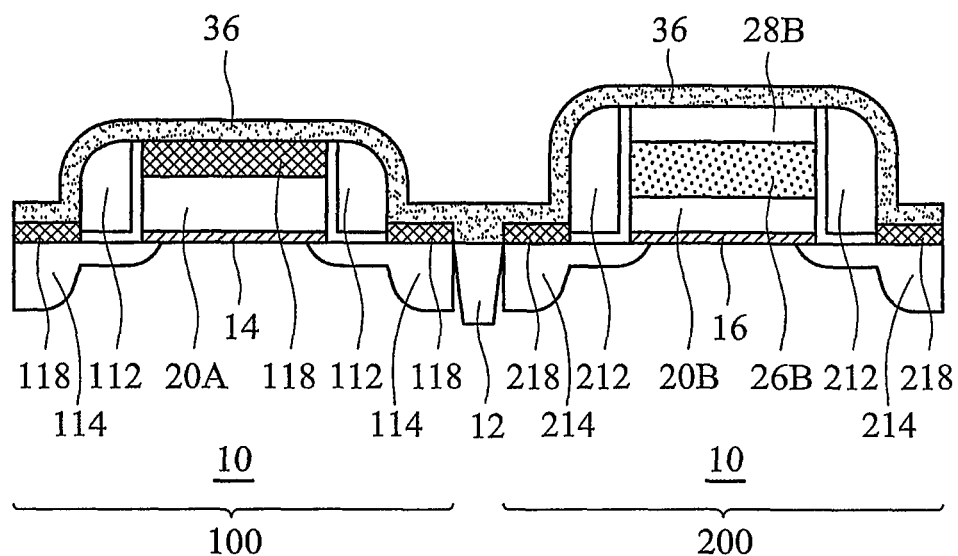

In FIG. 13, contact etch stop layer (CESL) 36 is formed to cover both regions 100 and 200. As is known in the art, CESL 36 may be formed of dielectric materials such as silicon nitride, and preferably applies desirable stresses to the underling MOS devices.

Figure 14:
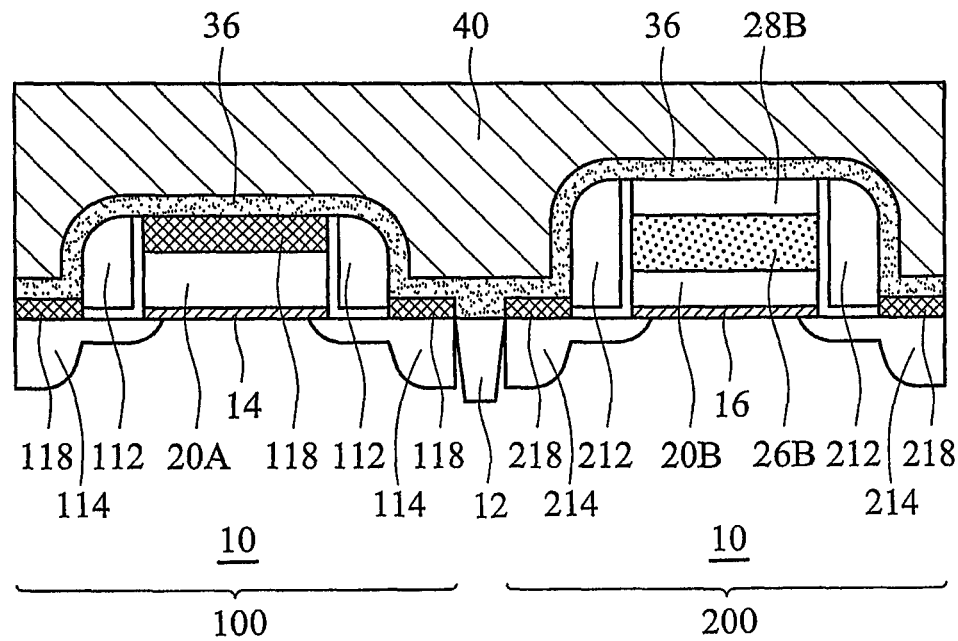
Figure 15:
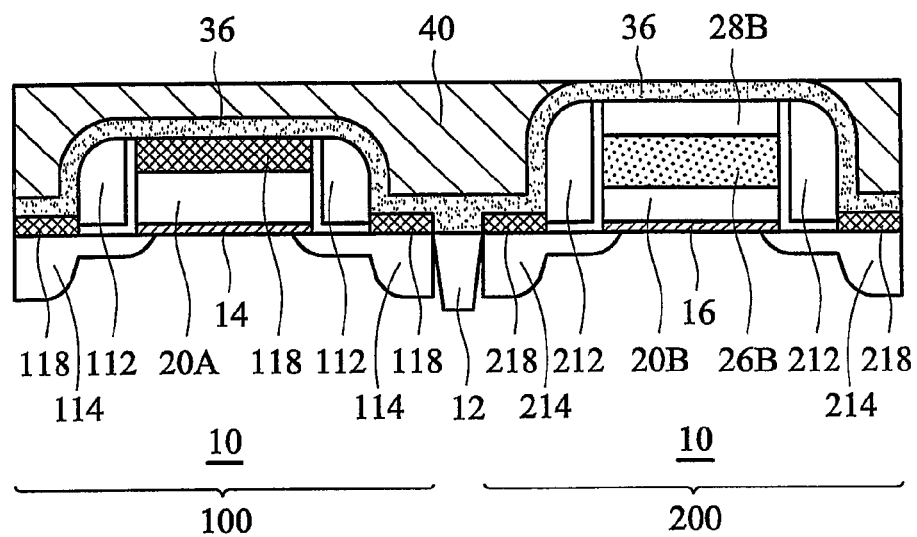

FIGS. 14 and 15 illustrate the formation of inter-layer dielectric (ILD) 40. In FIG. 14, ILD 40, which may include the commonly used dielectric materials such as boronphosphosilicate glass (BPSG), carbon-containing dielectrics, or the like, is deposited. The top surface of ILD 40 is higher than the top of CESL 36. By using CESL 36 as a CMP stop layer, a planarization, for example, a chemical mechanical polish (CMP), is then performed to lower the top surface of ILD 40 to the top surface of CESL 36. The resulting structure is shown in FIG. 15. In alternative embodiments, hard mask 28B is used as the CMP stop layer.

Figure 16:
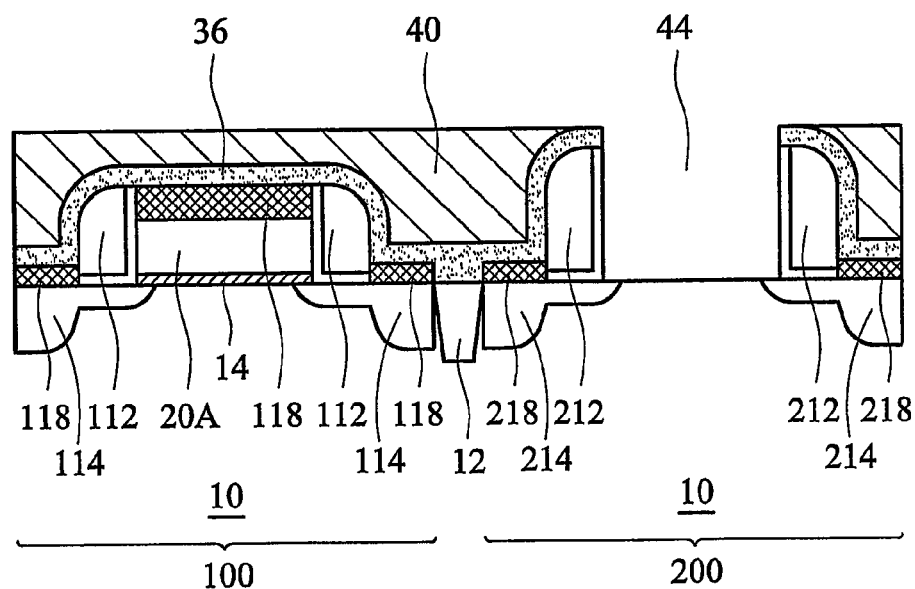
Figure 17:
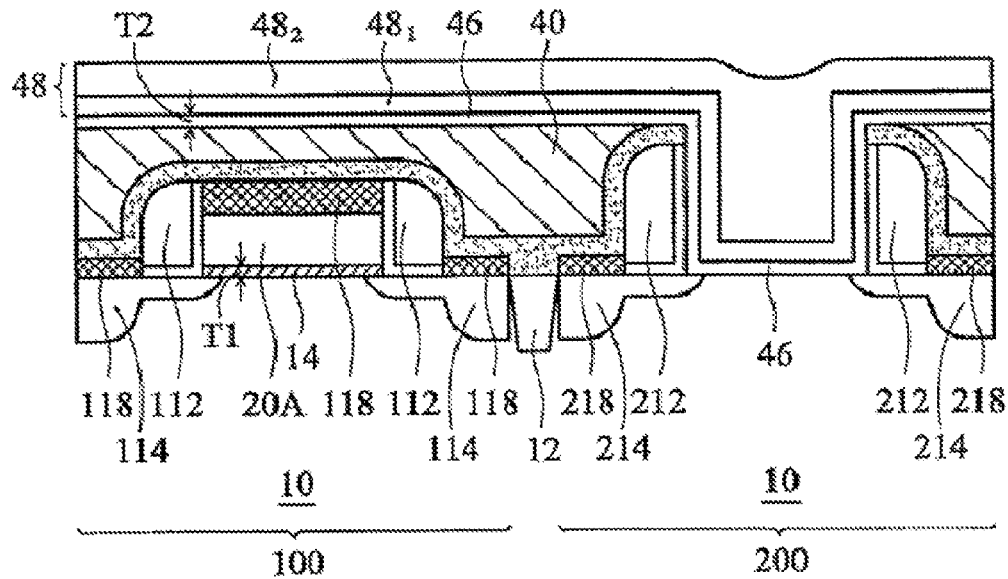
Figure 18:
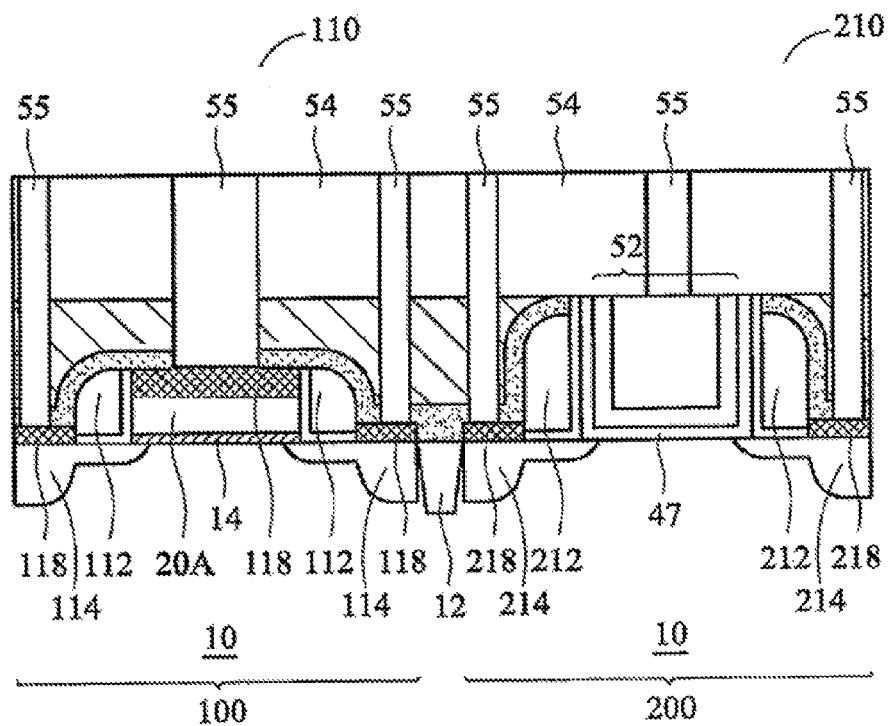

FIGS. 16 through 18 illustrate a gate-last approach for forming a gate dielectric and a gate electrode in region 200. Referring to FIG. 16, the exposed CESL 36, hard mask 28B, and a dummy gate including silicon layers 26B and 20B are removed, forming opening 44, wherein gate spacers 212 form the sidewall of opening 44. Sacrificial layer 16 may also be removed or thinned. Alternatively, layer 16 is formed of a high-k dielectric material, and is left unremoved to act as the gate dielectric of the resulting MOS device. In FIG. 17, high-k dielectric layer 46 is blanket formed, for example, to a thickness T2 of between about 5 Å and about 30 Å. The thickness T2 is preferably less than the thickness T1 of gate dielectric 14. The exemplary materials of high-k dielectric layer 46 include silicon-containing dielectric materials, such as $HfSiO_4$, HfSiON, HfSiN, $ZrSiO4$, ZrSiON, ZrSiN, or the like, or metal oxides such as $ZrO_2$, $HfO_2$, $La_2O_3$, or the like. High-k dielectric layer 46 extends into opening 44, with a portion at the bottom, and portions on sidewalls, of opening 44. Metal layer 48 is then formed to fill opening 44. Preferably, metal layer 48 is formed of metals having appropriate work functions for the respective MOS devices. For example, for NMOS devices, metals having low work functions are used, while for PMOS devices, metals having high work functions are used. In an exemplary embodiment, metal layer 48 includes sub layer $48_1$, and sub layer $48_2$ on sub layer $48_1$. Preferably, sub layer $48_1$ is thick enough, for example, with a thickness greater than about 3 μm, so that it determines the work function of the resulting gate electrode. Sub layer $48_2$ preferably has a good gap-filling ability, and may contain tungsten. The methods of forming the high-k dielectric layer 46 and metal layer 48 include commonly used methods such as CVD, ALD, PECVD, physical vapor deposition (PVD), etc.

Referring to FIG. 18, a CMP is performed to remove excess portions of high-k dielectric layer 46 and metal layer 48. The portions remaining in opening 44 forms gate dielectric 47 and gate 52 of the resulting MOS device 210. In subsequent process steps, an additional ILD 54 is formed over ILD 40, and contact plugs 55 are formed in ILDs 40 and 54 to connect to the source/drain regions and gates of MOS devices 110 and 210. In an embodiment, MOS device 210 is a core MOS device in a core circuit. In other embodiments, MOS device 210 is a SRAM MOS device.

Figure 19:
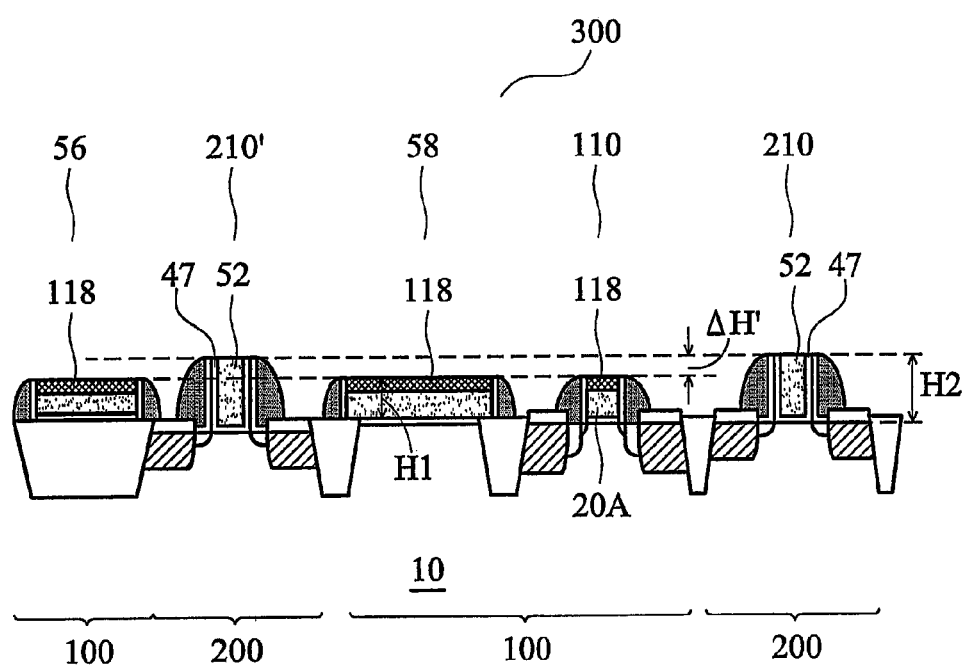
FIG. 19 is a cross-sectional view of MOS devices, a resistor, and, a MOS capacitor.

FIG. 19 schematically illustrates various devices formed using the embodiments of the present invention, which devices include resistor 56, MOS capacitor 58, SRAM MOS device 210', core MOS device 210, and I/O MOS device 110. In the preferred embodiment, as discussed in the preceding paragraphs, resistors 56 and one of the capacitor plate (the plate over substrate 10) of MOS capacitor 58 are formed simultaneously with the gate electrode 20A (and the overlying silicide region 118) of I/O MOS device 110. Further, SRAM MOS device 210' is formed simultaneously, and hence comprises same gate materials and has the same gate thickness as core MOS device 210. If the gate height (including gate silicides 118) of core MOS device 210 and SRAM MOS device 210' is denoted as H1, and the gate height of I/O MOS device 110 is denoted as H2, then H2 is preferably greater than H1 by the height difference ΔH', which is equal to, or greater than, the thickness of CESL 36 (refer to FIG. 18). With height difference ΔH', MOS device 110, resistor 56, and capacitor 58 are protected from the subsequent CMP performed on ILD 40 (refer to FIG. 15).

The embodiments of the present invention have several advantageous features. First, since resistors, MOS capacitors, and the gate electrodes of I/O MOS devices are formed of (poly)silicon, conventional standard libraries of these devices can still be used. On the other hand, core and SRAM MOS devices adopt metal gates so that the performance improvement can still be achieved. The embodiments of the present invention provide an integrated manufacturing process for forming resistors, MOS capacitors, I/O MOS devices, SRAM MOS devices, and core MOS devices with reduced complexity and cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
    forming a dielectric layer over a semiconductor substrate in a first region of the semiconductor substrate and a second region of the semiconductor substrate;
    forming a first layer over the dielectric layer in the first region and the second region;
    forming a second layer over the first layer in the second region, the second layer not being in the first region;
    patterning the first layer in the first region to form a first gate electrode of a first transistor device;
    patterning the first layer and the second layer in the second region to form a dummy gate of a second transistor device; and
    replacing the dummy gate with a metal gate to form a second gate electrode for the second transistor device.

2. The method of claim 1 further comprising forming a resistor and a plate of a capacitor simultaneously with the patterning the first layer in the first region to form the first gate electrode.

3. The method of claim 1 further comprising:
    forming an additional dummy gate electrode of a third transistor device simultaneously with the second patterning; and
    replacing the additional dummy gate with an additional metal gate to form a third gate electrode for the third transistor device, wherein the second transistor device and the third transistor device are components of a static random access memory device and a core transistor device, respectively.

4. The method of claim 1, wherein the step of forming the second layer comprises:
    forming a hard mask to cover a portion of the first layer in the first region;
    blanket forming the second layer, wherein the second layer is over the hard mask; and
    removing a portion of the second layer in the first region.

5. The method of claim 1, wherein the step of replacing the dummy gate comprises:
    forming an inter-layer dielectric (ILD) in the first and the second regions and over the first layer and the second layer;
    exposing the second layer in the second region through the ILD, wherein the first layer in the first region is not exposed;
    removing the dummy gate comprising the first layer and the second layer in the second region to form an opening;
    blanket forming a high-k gate dielectric layer, wherein the high-k gate dielectric layer extends into the opening; and
    filling the opening with a metallic material.

6. The method of claim 1, wherein each of the first layer and the second layer comprises polysilicon.

7. The method of claim 1 further comprising forming an etch stop layer (ESL) over the dummy gate and the first gate electrode.

8. A method of forming an integrated circuit structure, the method comprising:
    forming a first gate dielectric layer over a semiconductor substrate, the semiconductor substrate having a first region and a second region;
    forming a first polysilicon layer in the first region and the second region, wherein the first polysilicon layer is over the first gate dielectric layer;
    forming a first hard mask covering a first portion of the first polysilicon layer in the first region, wherein a second portion of the first polysilicon layer in the second region is uncovered by the first hard mask;
    blanket forming a second polysilicon layer over the first hard mask and the first polysilicon layer;
    blanket forming a second hard mask layer over the second polysilicon layer;
    removing portions of the second hard mask layer and the second polysilicon layer from the first region;
    performing a first patterning on the first portion of the first polysilicon layer to form a gate electrode for an input/output (I/O) MOS device;
    performing a second patterning on the first polysilicon layer and the second polysilicon layer in the second region to form a dummy gate for a core MOS device;
    forming a contact etch stop layer (CESL) over the I/O MOS device and the core MOS device;
    forming an inter-layer dielectric (ILD) over the CESL;
    performing a chemical mechanical polish (CMP) until at least a portion of the CESL directly over the dummy gate is exposed; and
    replacing the dummy gate with a metal gate to form a first gate electrode for the core MOS device.

9. The method of claim 8 further comprising forming a resistor and a plate of a MOS capacitor simultaneously with the first patterning.

10. The method of claim 8 further comprising:
    forming an additional dummy gate electrode of a static random access memory (SRAM) MOS device simultaneously with the second patterning; and
    replacing the additional dummy gate with an additional metal gate to form a gate electrode for a static random access memory (SRAM) MOS device.

11. The method of claim 8, wherein after the step of performing the CMP, a portion of the CESL directly over the I/O MOS device is covered by a remaining layer of the ILD.

12. The method of claim 8, wherein after the step of performing the CMP, a portion of the CESL directly over the I/O MOS device is exposed.

13. A method of forming an integrated circuit structure, the method comprising:
    forming a first metal-oxide semiconductor (MOS) device in a first region of a semiconductor substrate, the forming the first MOS device comprising:

forming a first gate dielectric over the semiconductor substrate; and forming a first gate electrode over the first gate dielectric;

forming an etch stop layer (ESL) over the first MOS device and directly over the first gate electrode;

forming an inter-layer dielectric on the ESL and directly over the first gate electrode; and forming a second MOS device in a second region of the semiconductor substrate, the forming the second MOS comprising:

forming a second gate dielectric over the semiconductor substrate; and forming a second gate electrode over the second gate dielectric, the ESL and the inter-layer dielectric remaining directly over the first gate electrode while the second gate electrode is formed, the second gate electrode having a height greater than a height of the first gate electrode, and the second gate dielectric comprising a planar portion underlying the second gate electrode and sidewall portions extending on respective sidewalls of the second gate electrode.

14. The method of claim 13, wherein the first MOS device is an input/output MOS device, and the second MOS device is a core MOS device.

15. The method of claim 14 further comprising forming a static random access memory device comprising:

forming a third gate dielectric on the semiconductor substrate; and forming a third gate electrode over the third gate dielectric, wherein the third gate dielectric and the third gate electrode are formed simultaneously with the second gate dielectric and the second gate electrode, respectively.

16. The method of claim 13, wherein the forming the second MOS device comprising:

exposing a material on the substrate using, at least in part, a planarization;

removing the material to form an opening; and forming the second gate dielectric and the second gate electrode in the opening.

17. The method of claim 16, wherein the second gate dielectric is conformally formed in the opening.

18. A method of forming an integrated circuit structure, the method comprising:

forming a first metal-oxide semiconductor (MOS) device in a first region of a semiconductor substrate, the forming the first MOS device comprising:

forming a first gate dielectric over the semiconductor substrate; and forming a first gate electrode over the first gate dielectric;

forming an etch stop layer (ESL) over the first MOS device and directly over the first gate electrode; and forming a second MOS device in a second region of the semiconductor substrate, the forming the second MOS comprising:

forming a second gate dielectric over the semiconductor substrate; and forming a second gate electrode over the second gate dielectric, the ESL remaining directly over the first gate electrode while the second gate electrode is formed, the second gate electrode having a height greater than a height of the first gate electrode, and the second gate dielectric comprising a planar portion underlying the second gate electrode and sidewall portions extending on respective sidewalls of the second gate electrode, wherein the step of forming the second gate electrode comprises:

forming a first silicon layer, wherein the first silicon layer is in both the first and the second regions;

forming a second silicon layer in the second region, wherein the first region is free from the second silicon layer;

patterning the first and the second silicon layers in the second region to form a dummy gate; and replacing the dummy gate with the second gate electrode comprising a metal.

19. The method of claim 18, wherein the step of forming the first gate electrode comprises:

patterning the first silicon layer in the first region; and forming a silicide region on the first silicon layer.

20. The method of claim 19 further comprising:

forming a silicon portion of a resistor simultaneously with the step of patterning the first silicon layer; and forming a plate of a MOS capacitor simultaneously with the step of patterning the first silicon layer.

* * * * *